United States Patent
Sanger et al.

(10) Patent No.: US 6,498,713 B2
(45) Date of Patent: Dec. 24, 2002

(54) LOW-INDUCTANCE CAPACITOR AND A METHOD FOR MINIMIZING INDUCTANCE IN A SNUBBER CIRCUIT

(75) Inventors: Phillip A. Sanger, Monroeville, PA (US); Lyon Mandelcorn, Pittsburgh, PA (US); Leban E. Lesster, Boston, MA (US); Frank A. Lindberg, Baltimore, MD (US)

(73) Assignee: SatCon Technology Corporation, Cambridge, MA (US)

( * ) Notice: Subject to any disclaimer, the term of this patent is extended or adjusted under 35 U.S.C. 154(b) by 0 days.

(21) Appl. No.: 09/809,907

(22) Filed: Mar. 16, 2001

(65) Prior Publication Data

US 2001/0024353 A1 Sep. 27, 2001

Related U.S. Application Data

(60) Provisional application No. 60/189,963, filed on Mar. 17, 2000.

(51) Int. Cl.[7] .............................................. H01G 4/005
(52) U.S. Cl. .................... 361/303; 361/306.1; 361/309; 361/310; 361/306.2
(58) Field of Search ............................. 361/303, 306.1, 361/306.3, 309, 306.2, 307, 308.1, 310, 321.2, 321.5, 304, 301.4, 322, 329

(56) References Cited

U.S. PATENT DOCUMENTS

| | | | |
|---|---|---|---|
| 4,590,537 A | 5/1986 | Sakamoto | 361/306 |
| 4,814,940 A * | 3/1989 | Horstmann et al. | |
| 5,450,278 A * | 9/1995 | Lee et al. | |
| 5,947,093 A | 9/1999 | Ward | 123/598 |
| 6,142,130 A | 11/2000 | Ward | 123/606 |
| 6,177,848 B1 | 1/2001 | Hopkinson et al. | 333/172 |
| 6,181,586 B1 | 1/2001 | Kalfhaus | 363/73 |
| 6,195,270 B1 | 2/2001 | Wittenbreder | 363/17 |
| 6,198,257 B1 | 3/2001 | Belehradek et al. | 323/222 |
| 6,198,260 B1 | 3/2001 | Wittenbreder | 323/271 |
| 6,243,253 B1 * | 6/2001 | DuPre et al. | |
| 6,257,372 B1 * | 8/2001 | Vassallo et al. | |
| 6,282,079 B1 * | 8/2001 | Nagakari et al. | |

OTHER PUBLICATIONS

*Power Capacitor Handbook*, Ed. by T. Longland, et al., CA Worth, Butterworth & Co. (Publishers) Ltd., 1984, pp. 256–260.

* cited by examiner

*Primary Examiner*—Anthony Dinkins
*Assistant Examiner*—Nguyen T Ha
(74) *Attorney, Agent, or Firm*—Dike, Bronstein, Roberts & Cushman IP Group Edwards & Angell, LLP; George W. Neuner; George W. Hartnell, III

(57) ABSTRACT

A low-voltage, low-inductance device for storing electrical charge in a snubber circuit and a method of minimizing inductance in the snubber circuit using the device, wherein the device includes a plurality of extended electrodes, in parallel or series, that are joined to a positive conductor terminal at one end spray and at a negative conductor terminal at the other end spray so that end sprays of adjacent extended electrodes are alternately joined to the positive and negative conductor terminals. Accordingly, current flowing though adjacent extended electrodes is of substantially equal intensity but different in direction. As a result, inductance produced effectively cancels out that of adjacent extended electrodes.

24 Claims, 4 Drawing Sheets

LOW-INDUCTANCE CAPACITOR AND A METHOD FOR MINIMIZING INDUCTANCE IN A SNUBBER CIRCUIT

REFERENCE TO RELATED APPLICATIONS

The present invention claims a right of priority to provisional application 60/189,963 entitled Low Inductance Capacitor filed on Mar. 17, 2000.

FIELD OF THE INVENTION

The present invention relates to devices for electric circuitry. More precisely, the invention relates to low voltage capacitors that produce minimal inductance, e.g., for snubber circuitry, and to methods for minimizing inductance in same.

BACKGROUND OF THE INVENTION

Capacitance, i.e., the ability of capacitors to store charge, plays a dominant role in shaping the time and frequency response of modern electrical circuitry. However, capacitance can be affected deleteriously by stray inductance, which is a flux field that is produced by current flowing through wires and/or conduction paths of substantially all electrical circuits and circuitry. Indeed, current (I) flowing through circuitry can cause significant voltages (V) to develop across stray inductance (L), which condition diminishes capacitance (C). Therefore, for optimal performance, inductance associated with capacitors must be as low as possible. This is especially true at higher frequencies, i.e., 5 kHz and higher, where inductive impedance diminishes capacitive effectiveness by amplifying microsecond pulses to high voltage levels.

This is particularly true of snubber capacitors, which are connected in parallel with one or more switches as part of a snubber circuit. Snubber circuits typically are used to (i) reduce voltage spikes, e.g., switching pulses, that occur when power switches are turned on and off, i.e., "switched", repeatedly and (ii) to reduce power and other losses that also result from repeated switching. Indeed, power loss, which is defined by the equation $P=V \times I$, is substantially zero when either there is no current flow, i.e., $I=0$, which occurs when the switch is off, and/or when the voltage is very low, i.e., $V=>0$. When neither of these conditions exists, the circuitry experiences significant power loss.

As a result, snubber capacitors, which typically operate at high current levels, i.e., $I>>0$, by default, must be designed to suppress switching pulses in inverter circuits to as low voltage levels as possible. Accordingly, the use of snubber capacitors in this capacity requires a very low inductance, otherwise, solid state devices, e.g., insulated gate bi-polar transistors ("IGBTs"), and/or insulation may fail if the inductance and associated voltage are too high.

DESCRIPTION OF THE RELATED ART

Bowers (U.S. Pat. No. 6,166,932) discloses snubber circuitry that minimizes oscillations that are caused by repeated switching. Indeed, the snubber circuitry of Bowers includes a pair switches in parallel with a pair of capacitors, wherein an air-core transformer that is in series with a relatively high value resistor is disposed in close proximity of the capacitors to inductively couple resistance in the branch circuit without introducing additional stray inductance, which might otherwise be the case were the resistors directly connected to the capacitors in series. Hence, Bowers purports to reduce inductance in the snubber circuitry by providing distance between the resistors and the capacitors.

Furthermore, the prior art keeps inductance in interconnects and terminals by making interconnects and terminals as short as possible and/or by reducing the distance between adjacent edges of terminals.

However, the prior art has apparently failed to appreciate that to obtain low inductance in snubber capacitor design: (i) the cross-sectional area of the capacitor should be as large as possible, while the length, however, is kept to a minimum; (ii) design includes a high aspect ratio for low cross-sectional charge density; and (iii) conductors and/or terminals of opposite polarity should be disposed as close to one another as possible so that their respective flux fields—which produce inductance—substantially cancel out each other.

SUMMARY OF THE INVENTION

The present invention produces a low-inductance capacitance device, which is particularly useful with snubber circuitry. The cross-sectional area of the disclosed capacitor is relatively large although its length is kept to a minimum. The present invention provides a capacitor that includes a high aspect ratio for low cross-sectional charge density. Furthermore, the present invention comprises capacitors in combination with conductors and/or terminals of opposite polarity that are disposed close to one another so that the inductance produced by the flux fields substantially cancels out each other.

Accordingly, the invention provides a low-inductance device for storing electrical charge comprising a plurality of extended electrodes, wherein electrical current passing through a extended electrode from said plurality of extended electrodes flows in a direction opposite of current passing through one or more adjacent extended electrodes of said plurality of extended electrodes to provide cancellation of inductance in the device.

The invention as provides a method of reducing the inductance of a device used for storing an electrical charge, the device having a plurality of extended electrodes having a first end spray and a second end spray, the method comprising the steps of: sandwiching an insulating film between a positive conductor terminal and a negative conductor terminal; and joining said negative conductor terminal to each of the plurality of extended electrodes at a first end spray and said positive conductor terminal to each of the plurality of extended electrodes at a second end spray so that the end sprays of adjacent extended electrodes are joined to the negative conductor terminal and the positive conductor terminal alternately so that current flows in opposite directions between first and second end sprays of adjacent extended electrodes.

BRIEF DESCRIPTION OF THE DRAWINGS

For a fuller understanding of the nature and desired objects of the present invention, reference is made to the following detailed description taken in conjunction with the accompanying drawing figures wherein like reference character denote corresponding parts throughout the several views and wherein.

DETAILED DESCRIPTION OF THE INVENTION AND PREFERRED EMBODIMENTS

Figure 1:
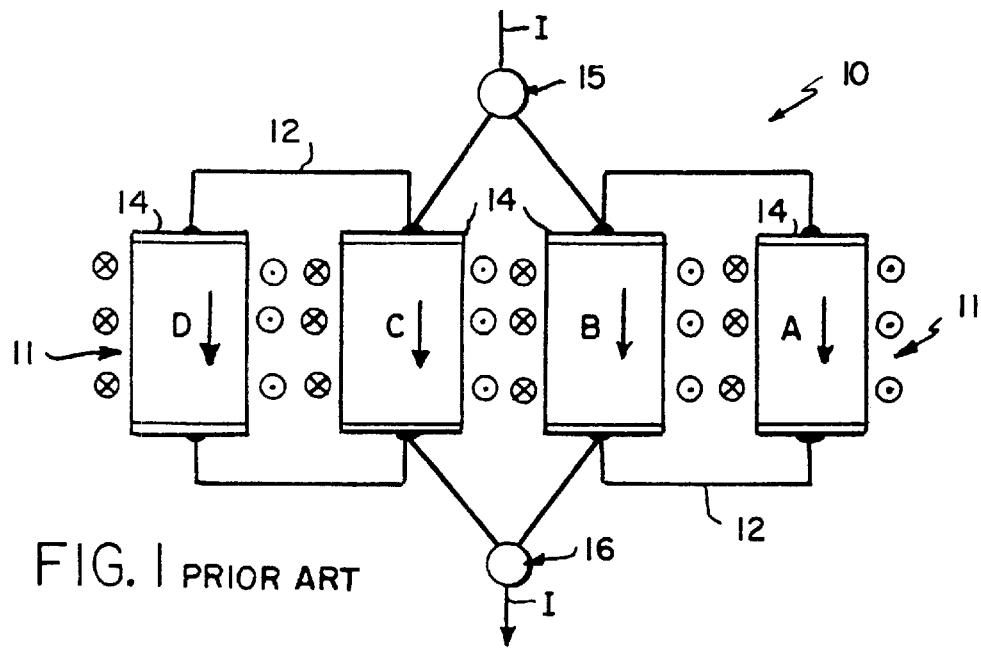
FIG. 1. shows an embodiment of a conventional capacitor having parallel sections.

FIG. 1 shows an example of a conventional capacitor 10, having parallel sections 11, interconnects 12, and terminals 15, 16, commonly found and practiced in the prior art. Shown is a capacitor 10 with four sections 11, which are labeled A, B, C, and D. Each section 11 comprises a pair of end sprays 14, which are disposed at a distal and a proximal end of the section 11. Because the sections 10 are connected in parallel, four end sprays 14 common to the distal end are connected to a first terminal 15 and four end sprays 14 common to the proximal end are connected to a second terminal 16.

The sections 11 of the capacitor 10 are oriented in a common direction (as shown by the arrows). Consequently, as current I passes through the first terminal 15 and through the sections 11, the current I produces, i.e., induces, inductance, which has a common direction. Accordingly, the total inductance produced by the capacitor 10 is the sum of the individual inductances produced by the sections A, B, C, and D.

Figure 2B:
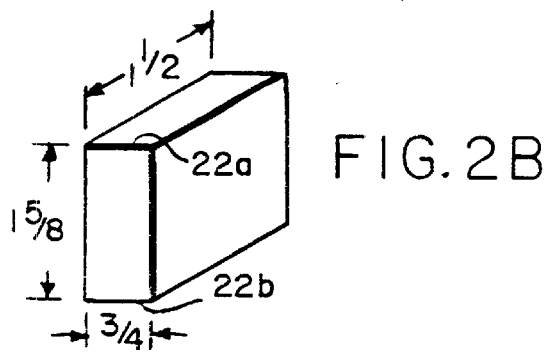
FIG. 2B shows an illustrative embodiment of a capacitor section according to the present invention.
Figure 2A:
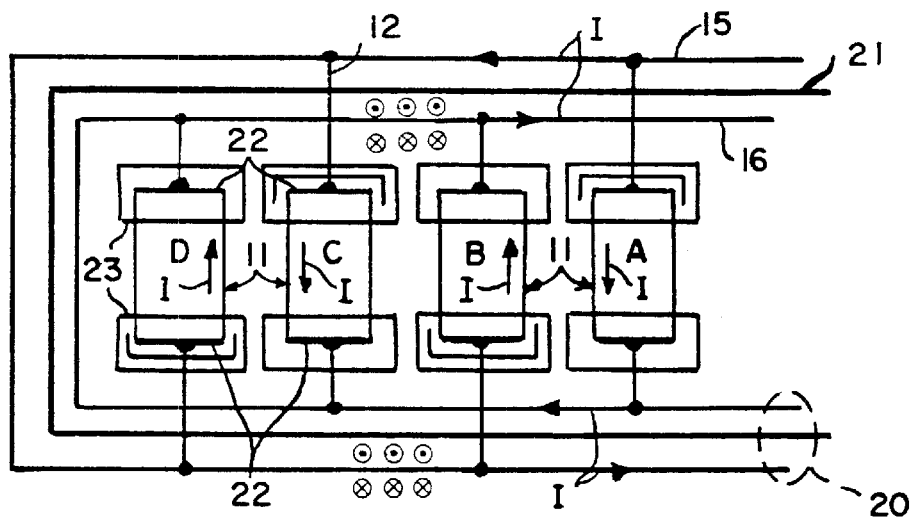
FIG. 2A shows an illustrative embodiment of a snubber capacitor having parallel sections according to the present invention.

By comparison, FIG. 2A shows an illustrative embodiment of the present invention for capacitor sections 11 in parallel. Shown are the interconnect-terminal arrangements for a capacitor 10 having four metallized film sections 11 in parallel. It should be noted that those skilled in the pertinent art can design capacitors 10 with more or fewer metallized film sections 11 without violating the scope and spirit of this disclosure.

The capacitor 10 includes a conductor-insulator-conductor sandwich 20 arrangement, which provides both interconnects 12 and terminals 15 and 16 for a bank of extended electrodes, e.g., metallized film sections or MLC layers, 11. Preferably, the conductor-insulator-conductor sandwich 20 comprises two substantially planar, i.e., substantially flat, approximately 5 to 20 mil thick by ¾ inch wide conductors 15 and 16 that are separated by an approximately 3 mil thick by ⅞ inch wide layer of insulating film 21. It is important that the insulating film layer 21 extend beyond the edges, i.e., the outer perimeter, of the conductors 15 and 16 in all directions to further minimize inductance. Indeed, insulating films 21 isolate end sprays 22 attached to one of the conductors from adjacent end sprays 22 as well as from the other conductor.

For example, preferably, the conductors 15 and 16 are flat metal sheets, e.g., made of copper or aluminum, that are joined, e.g., laminated, to produce a conductor-insulating film-conductor sandwich 20. Current I of substantially equal intensity flows in opposite directions in conductors 15 and 16 (as shown by arrows in FIG. 2A). As a result, the magnetic flux fields induced by the conductors 15 and 16 overlap and effectively cancel, which is to say, that inductance produced by the first conductor 15 is substantially equal in intensity but opposite in direction to the inductance produced by the second conductor 16. Consequently, net inductance is negligible.

Preferably, the conductors 15 and 16 are joined to either the first end spray 22a or the second end spray 22b of the each of the four sections 11 in an alternating fashion. For example, the first end spray 22a of section A is joined to the first conductor 15 and the second end spray 22b of section A is joined to the second conductor 16. Section B, which is immediately adjacent to section A, is joined just the opposite, i.e., the first end spray 22a of section B is joined to the second conductor 16 and the second end spray 22b of section B is joined to the first conductor 15. Sections C and D are joined to the conductors 15 and 16 in like manner as described for sections A and B, respectively.

Preferably, end sprays 22 are joined to the negative, inner conductor 16 by spot welding and to the positive, outer conductor 15 using an extension spot weld, i.e., connected through bridging tabs (not shown) that extend beyond the edge of the conductors 15 and 16. The negative, inner conductor 16 is isolated from the end sprays 22 to which it is not joined and the end sprays 22 are isolated from each other by an insulating film collar 23. In one embodiment, the insulating film collar 23 comprises an approximately 3 mil thick, ⅝ inch wide collar that is disposed about each end spray 22 about ¹⁄₁₆ inch beyond the windings. It will become obvious to those skilled in the art that the present invention can be practiced using other methods of joining end sprays 22 to the conductors 15 and 16, which methods are within the scope and spirit of this disclosure.

Accordingly, the current I flowing in each of the sections 11 is substantially equal in intensity but opposite in direction to current flowing in adjacent sections 11. Thus, magnetic flux fields induced by the current I flowing in the sections 11 overlap and effectively cancel, which is to say, that inductance produced by the sections A and C is substantially equal in intensity but opposite in direction to the inductance produced by the sections B and D so that the net inductance is negligible.

For example, a metallized polypropylene film capacitor 10 was built using two 14 $\mu$F ("micro-Farads") sections and two 12 $\mu$F sections according to the present invention and tested. The conductors 15 and 16 extended about 1¼ inch beyond the edge of the bank of sections 11. The section end sprays 22 were about ¾ inch wide, about 3 mil thick, and about 1½ inches high. Furthermore, the first end spray 22a was about 1⅝ inches from the second end spray 22b. See FIG. 2B. The inductance measured during testing was about 3.2 nH ("nano-Henrys"). By comparison, the inductance produced in a comparable, conventional MP8-12820K, 52 $\mu$F, 600V-type snubber capacitor from Electronics Concepts, Inc. ("ECI") is about 24.8 nH. As a result, the present invention produces about one-eighth the inductance as a conventional capacitor. Correspondingly, the snubber capacitor of the present invention reduces inductance in the snubber circuitry by almost 90 percent from conventional snubber capacitors.

Figures 3A, 3B:
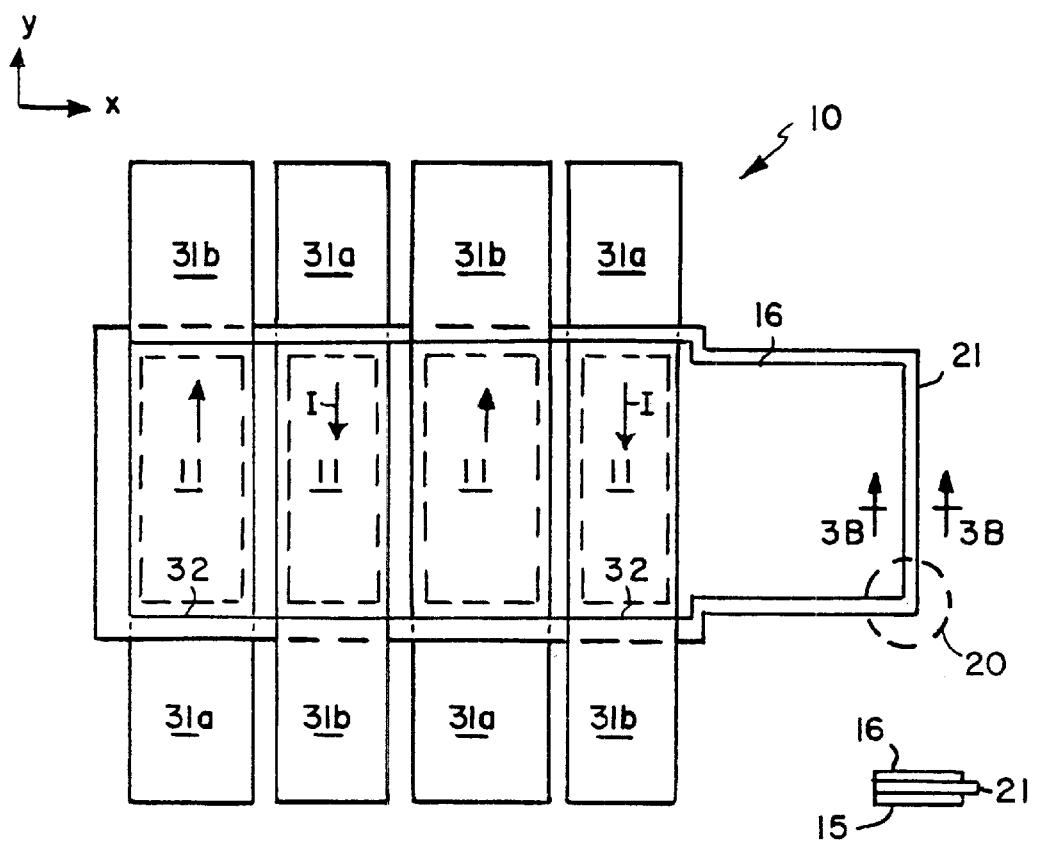
FIG. 3A shows another illustrative embodiment of a snubber capacitor having parallel sections according to the present invention.
FIG. 3B shows a sectional view of the conductor-insulating film-conductor sandwich taken along line 3B—3B in FIG. 3A.

An alternative embodiment of the present invention preferably uses substantially flat, overlapping conductors 15 and 16 that are disposed in a conductor-insulating film-conductor sandwich 20 similar to the one that has been described above. See FIG. 3A. As with the first embodiment, the two conductors 15 and 16 are substantially planar and are joined, e.g., laminated, so that an insulating film 21 extends beyond the edges, i.e., the outer perimeter of the conductors 15 and 16. The insulating film 21 isolates electrode terminations 32 from the overlaying conductor 16, or, alternatively, the underlying conductor 15 as well as from adjacent electrode terminations 32.

Electrode tabs 31a and 31b are joined to the underlying first conductor 15 and the overlying second conductor 16, respectively, e.g., by soldering. See FIG. 3B. Alternately, the conductors 15 and 16 can be manufactured with the electrode tabs 31a and 31b, respectively, e.g., by stamping from the same sheet metal. In this latter embodiment, the electrode tabs 31a and 31b are disposed approximately perpendicular to the conductors 15 and 16, i.e., the z-direction, which is to say that the electrode tabs 31a and 31b are bent upwards.

An embodiment using sections 11 in series will now be discussed.

Figure 4:
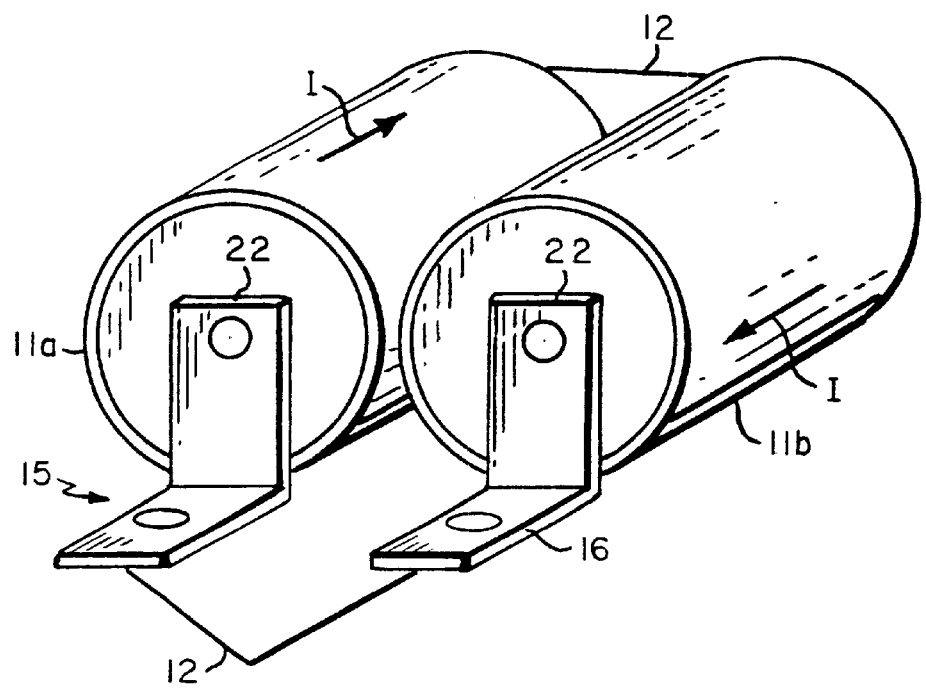
FIG. 4 shows an embodiment of a conventional capacitor having terminals and interconnects in series.

With the prior art, when two sections 11 are in series, the simplest interconnection 12 between adjacent electrodes extensions 32 or end sprays 22 produces mutual cancellation of inductance through the sections 11a and 11b as current I of substantially equal intensity flows in opposite directions. See FIG. 4. However, with conventional snubber capacitors 10 in series, the terminals 15 and 16 are disposed too far apart relative to the other for significant inductance cancellation.

Figure 5:
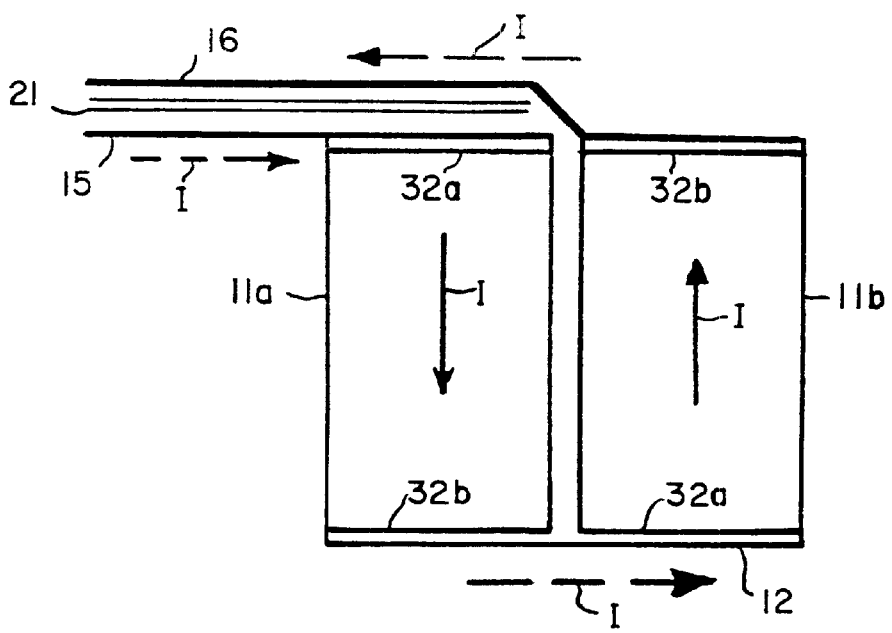
FIG. 5 shows an illustrative embodiment of a snubber capacitor having sections in series according to the present invention.

Referring to FIG. 5, an illustrative embodiment of a capacitor 10 comprising sections 11a and 11b in series according to the present invention is shown. While only two sections 11a and 11b are shown in FIG. 5, those skilled in the pertinent art can practice the disclosed invention using more sections 11 in series without violating the scope and spirit of this disclosure.

A first terminal 15 is joined to the first electrode termination 32a of the first section 11a. Current I passes from the first electrode termination 32a to the second electrode termination 32b in the direction shown, producing inductance. The second electrode termination 32b of the first section 11a is interconnected to the first electrode termination 32a of the second section 11b by an interconnection 12. Current I passes from the first electrode termination 32a to the second electrode termination 32b in the direction shown, which direction is opposite of that of the first section 11a, also producing inductance. The second electrode termination 32b of the second section 11b is joined to the second terminal 16, which terminal 16 is separated from the first terminal 15 by an insulation film 21. Preferably, the electrode terminations 32a and 32b are joined to the interconnection 12 and terminals 15 and 16, e.g., by soldering.

For example, two metallized film PET capacitors 10 with two sections 11 in series were built to provide a capacitance of about 39 µF and tested. At a frequency of about 1 MHz, the conventional capacitor 10 produced an inductance of about 6.9 nH for 19.7 µF. By comparison, a series capacitor 11 built in accordance with the present invention, having an insulating film 21 thickness of about 2.4 µm, produced an inductance of about 6.0 nH at the same frequency and capacitance. As a result, the present invention produces about 13 percent less inductance than the conventional capacitor.

However, with this embodiment, the effect of sandwiching, or overlapping, the terminals 15 and 16 is limited to currents I in two adjacent capacitor sections 11a and 11b, which essentially are contiguous at some point with each other, and to a small depth into the windings. The magnetic flux fields due to the rest of the current elements in a winding are not exposed to canceling flux fields.

Figure 6A:
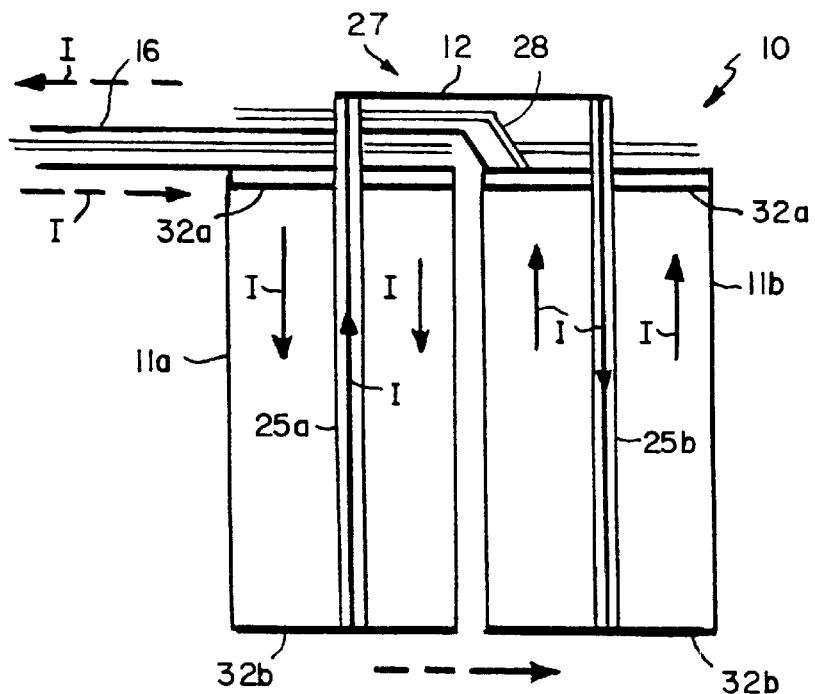
FIG. 6A shows a second illustrative embodiment of a snubber capacitor having sections in series according to the present invention.
Figure 6B:
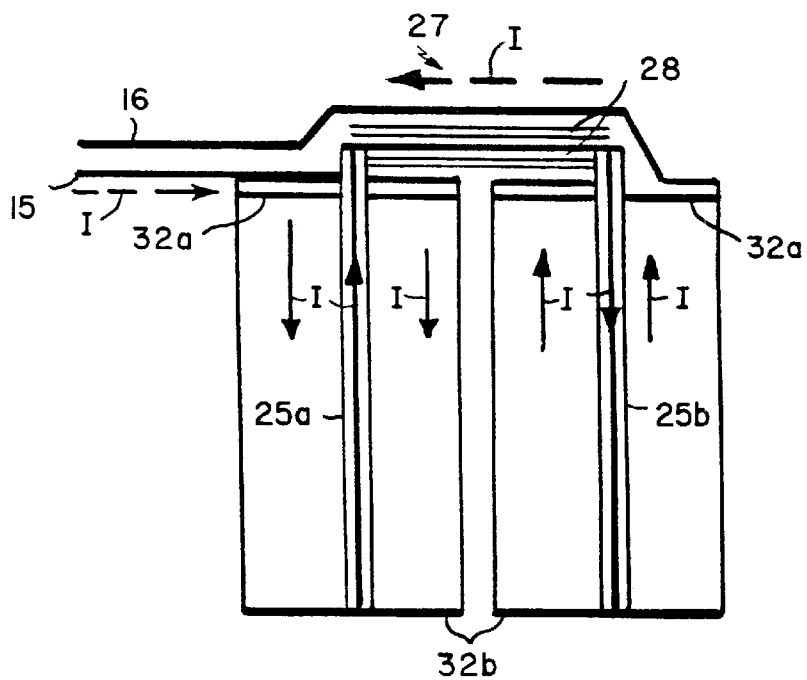
FIG. 6B shows a third illustrative embodiment of a snubber capacitor having sections in series according to the present invention.

FIGS. 6A and 6B show two additional embodiments for sections 11 in series for reducing inductance further. FIG. 6a shows a first and second section 11a and 11b of a capacitor 10 that include an insulated central interconnect 25. The insulated central section 25a of the first section 11a is interconnected to the insulated central section 25b of the first section 11b by an interconnection 12. The combination of the two insulated central sections 25a and 25b and the interconnection 12 create a bridging conductor 27.

Current I from the first terminal 15 passes from the first electrode termination 32a to the second electrode termination 32b of the first section 11a, where it passes through a first central interconnect 25a to an interconnection 12 and then to a second central interconnect 25b. The current I then passes to the first electrode termination 32a and on to the second electrode termination 32b of the second section 11b, where it passes to the second terminal 16. As the current I arrows in the FIG. 6A show, current I flowing through the central interconnects 25a and 25b is substantially equal in magnitude but opposite in direction of the current I flowing between the first and second electrode terminations 32a and 32b of each of the sections 11a and 11b. The magnetic flux field produced by current I flowing in the bridging conductor 27 is in relatively close proximity to and, accordingly, cancels some but not all of the magnetic field produced by current flowing between the electrode terminations 32a and 32b in both section 11a and 11b. Furthermore, the current I flowing in the first and second terminals 15 and 16 are in relatively close proximity so that the magnetic flux fields associated with each are substantially mutually canceling.

FIG. 6B shows another embodiment of a capacitor 10 similar to the embodiment described with reference to FIG. 6A. Indeed, the embodiment shown in FIG. 6B differs from the embodiment shown in FIG. 6A by the relative location of the bridging conductor 27 with respect to the second terminal 16. Indeed, with FIG. 6A, the interconnection 12 of the bridging conductor 27 is disposed above the second terminal 16 with insulation 28 therebetween. In contrast, with FIG. 6B, the second terminal 16 is disposed above the interconnection 12 of the bridging conductor 27 with insulation 28 disposed therebetween as well as between the interconnection 12 and the electrode terminations 32a and 32b of the sections 11a and 11b, respectively.

Although a number of embodiments of the invention have been described, it should be obvious to those skilled in the art that other embodiments to and/or modifications, combinations, and substitutions of the present invention are possible, all of which are within the scope and spirit of the disclosed invention.

What is claimed is:

1. A low inductance device for storing an electrical charge, the device comprising:
 a capacitor having a plurality of extended electrodes, wherein electrical current passing through each extended electrode from said plurality of extended electrodes flows in a direction opposite of current passing through one or more adjacent extended electrodes of said plurality of extended electrodes to provide cancellation of inductance in the device, and
 an insulating film collar that is disposed about a first end spray and a second end spray of each of the plurality of extended electrodes to further minimize inductance.

2. The device as recited in claim 1, wherein the insulating film collar is about 5/8 inch wide and about 3 mils thick.

3. A low inductance device for storing an electrical charge, the device comprising:

a capacitor having a plurality of extended electrodes, wherein electrical current passing through each extended electrode from said plurality of extended electrodes flows in a direction opposite of current passing through one or more adjacent extended electrodes of said plurality of extended electrodes to provide cancellation of inductance in the device;

a positive conductor terminal; and a negative conductor terminal;

wherein the negative conductor terminal is joined to each of the extended electrodes at a first end spray and the positive conductor terminal is joined to each of the extended electrodes at a second end spray so that the end sprays of adjacent extended electrodes are joined to the negative conductor terminal and the positive conductor terminal alternately so that current flows in opposite directions between first and second end sprays of adjacent extended electrodes, wherein a central interconnect is disposed centrally within each of the plurality of extended electrodes that are disposed in series, wherein the central interconnect of each of the plurality of extended electrodes in series are interconnected by a common interconnect to provide cancellation of inductance in the device.

4. The device as recited in claim 3, wherein the common interconnect is disposed substantially above the negative conductor terminal, wherein an insulating film is further disposed between the common interconnect and the negative conductor terminal.

5. The device as recited in claim 3, wherein the common interconnect is disposed substantially below the negative conductor terminal, wherein an insulating film is further disposed between the common interconnect and the negative conductor terminal.

6. The device as recited in claim 1, wherein each extended electrode is in parallel with one or more adjacent extended electrodes.

7. The device as recited in claim 1, wherein the device further comprises a positive conductor terminal and a negative conductor terminal, wherein the negative conductor terminal is joined to each of the extended electrodes at a first end spray and the positive conductor terminal is joined to each of the extended electrodes at a second end spray so that the end sprays of adjacent extended electrodes are joined to the negative conductor terminal and the positive conductor terminal alternately so that current flows in opposite directions between first and second end sprays of adjacent extended electrodes.

8. The device as recited in claim 7, wherein a central interconnect is disposed centrally within each of the plurality of extended electrodes that are disposed in series, wherein the central interconnect of each of the plurality of extended electrodes in series are interconnected by a common interconnect to provide cancellation of inductance in the device.

9. The device as recited in claim 7, wherein an insulating film separates the positive conductor terminal from the negative conductor terminal to produce a conductor-insulating film-conductor sandwich.

10. The device as recited in claim 9, wherein the insulating film is wider and longer in dimension than either of the positive and negative conductor terminals.

11. The device as recited in claim 7, wherein the positive and the negative conductor terminals are about 3/4 inch wide and between about 5 and 20 mils thick.

12. The device as recited in claim 9, wherein the conductor-insulating film-conductor sandwich is disposed so as to substantially surround the plurality of extended electrodes.

13. The device as recited in claim 9, wherein the conductor-insulating film-conductor sandwich is disposed substantially beneath the plurality of extended electrodes.

14. The device as recited in claim 7, wherein end sprays are joined to positive conductor terminals using an extension spot weld.

15. The device as recited in claim 7, wherein end sprays are joined to negative conductor terminals using soldering techniques.

16. The device as recited in claim 3, wherein each extended electrode is in parallel with one or more adjacent extended electrodes.

17. The device as recited in claim 3, wherein an insulating film separates the positive conductor terminal from the negative conductor terminal to produce a conductor-insulating film-conductor sandwich.

18. The device as recited in claim 17, wherein the insulating film is wider and longer in dimension than either of the positive and negative conductor terminals.

19. The device as recited in claim 3, wherein the positive and the negative conductor terminals are about 3/4 inch wide and between about 5 and 20 mils thick.

20. The device as recited in claim 17, wherein the conductor-insulating film-conductor sandwich is disposed so as to substantially surround the plurality of extended electrodes.

21. The device as recited in claim 17, wherein the conductor-insulating film-conductor sandwich is disposed substantially beneath the plurality of extended electrodes.

22. The device as recited in claim 3, wherein end sprays are joined to positive conductor terminals using an extension spot weld.

23. The device as recited in claim 3, wherein end sprays are joined to negative conductor terminals using soldering techniques.

24. The device as recited in claim 3, wherein the device further comprises an insulating film collar that is disposed about a first end spray and a second end spray of each of the plurality of extended electrodes to further minimize inductance.

* * * * *